United States Patent
Takahashi et al.

(10) Patent No.: US 6,793,124 B1
(45) Date of Patent: Sep. 21, 2004

(54) DIFFUSION-JOINED TARGET ASSEMLY OF HIGH-PURITY COBALT TARGET AND COPPER ALLOY BACKING PLATE AND PRODUCTION METHOD THEREFOR

(75) Inventors: Kazushige Takahashi, Ibaraki (JP); Hirohito Miyashita, Ibaraki (JP)

(73) Assignee: Nikko Materials Company, Limited, Tokyo (JP)

( * ) Notice: Subject to any disclaimer, the term of this patent is extended or adjusted under 35 U.S.C. 154(b) by 226 days.

(21) Appl. No.: 10/239,556

(22) PCT Filed: Jul. 6, 2001

(86) PCT No.: PCT/JP01/05902

§ 371 (c)(1),
(2), (4) Date: Sep. 23, 2002

(87) PCT Pub. No.: WO02/29130

PCT Pub. Date: Apr. 11, 2002

(30) Foreign Application Priority Data

Oct. 2, 2000 (JP) .......................................... 2000-302134

(51) Int. Cl.$^7$ ............................................... B23K 20/22
(52) U.S. Cl. .................... 228/194; 204/298.12; 428/655
(58) Field of Search ............................... 228/103, 193, 228/194, 121, 122.1, 56.3; 204/298.12, 298.13; 148/411, 536, 527; 428/655, 678

(56) References Cited

U.S. PATENT DOCUMENTS 5,653,856 A * 8/1997 Ivanov et al. .......... 204/192.12
5,836,506 A * 11/1998 Hunt et al. ................. 228/172
6,071,389 A   6/2000 Zhang
6,274,015 B1 * 8/2001 Beier et al. ............. 204/298.12
6,376,281 B1 * 4/2002 Kohler et al. ................ 438/118
6,451,185 B2 * 9/2002 Beier et al. ............. 204/298.12
6,521,108 B1 * 2/2003 Zhang ................... 204/298.13
6,555,250 B2 * 4/2003 Shah et al. .................. 428/652

FOREIGN PATENT DOCUMENTS

| JP | 62-202732 | 9/1987 |
| JP | 11-236665 | 8/1999 |
| JP | 2000-239837 | 9/2000 |

OTHER PUBLICATIONS

Patent Abstract of Japan, one page English abstract for JP 2000-239837, Sep. 2000.
Patent Abstract of Japan, one page English abstract for JP 11-236665, Aug. 1999.
One page–English translation of claims 1 & 2 of JP 62–202732, Sep. 1987.

* cited by examiner

Primary Examiner—Kiley Stoner
Assistant Examiner—Jonathan Johnson
(74) Attorney, Agent, or Firm—Howson and Howson

(57) ABSTRACT

The present invention relates to a diffusion bonding target assembly of a high purity cobalt target and a copper alloy backing plate diffusion bonded with an aluminum or aluminum alloy having a thickness of 0.5 mm or more as the insert material. Provided is a diffusion bonding target assembly of a high-purity cobalt target and a copper alloy backing plate capable of effectively sputtering a high purity cobalt ferromagnetic target and which does not generate warping or peeling upon diffusion bonding even under severe conditions such as bonding with the backing plate and high power sputtering, and the manufacturing method thereof.

2 Claims, 1 Drawing Sheet

DIFFUSION-JOINED TARGET ASSEMBLY OF HIGH-PURITY COBALT TARGET AND COPPER ALLOY BACKING PLATE AND PRODUCTION METHOD THEREFOR

BACKGROUND OF THE INVENTION

1. Field of the Invention

The present invention relates to a diffusion bonding target assembly of a high-purity cobalt target and copper alloy backing plate which does not generate warping or peeling upon diffusion bonding, and the manufacturing method thereof.

2. Description of the Related Art

Conventionally, when performing magnetron sputtering to a ferromagnetic target such as cobalt upon disposing a magnet to the back side of such target, it is difficult to generate a magnetic field on the target surface since the magnetic field will be blocked within the target. In other words, due to the magnetic field characteristic to cobalt, which is a ferromagnetic, the plasma density will not increase and the ionization efficiency of argon will decrease, thereby resulting in low sputtering efficiency.

Thus, when employing a ferromagnetic target such as cobalt, measures of merely thinning the target thickness were taken in order to leak the magnetic field.

Generally, with the conventional bonding of a target and backing plate, a low melting bonding material such as indium was used.

Nevertheless, since this type of bonding material (brazing filler material) such as indium is easily affected by heat, there is a problem in that it is not suitable for high power sputtering. In view of the above, diffusion bonding that does not use brazing filler material has been proposed.

Numerous actual performances with titanium and aluminum have been achieved in this diffusion bonding, and there is an advantage with diffusion bonding items in that aluminum or aluminum alloy, which is inferior in thermal conductivity in comparison to copper, may be used as the backing plate since such items do not use a brazing filler material. Moreover, since the specific gravity of aluminum is approximately ⅓ of that of copper, there is a benefit in that the target may be made lighter, and the handling will improve.

Nevertheless, with the combination of cobalt and aluminum or aluminum alloy, since the difference in the coefficient of thermal expansion is so large in comparison to titanium or aluminum, there is a possibility in that deformation may occur from the difference in coefficient of thermal expansion due to the bimetal effect when the temperature becomes too high.

In recent years, a method for performing even deposition is employed by ionizing sputtering particles with further high power sputtering and providing strong kinetic energy to the substrate. As a result, there are cases where a target to which is bonded a backing plate deforms due to the hydraulic pressure of the thermal influence and cooling medium during sputtering, and water may leak thereby.

Recently, the target itself is being enlarged pursuant to the enlargement of the aperture of the wafer, and problems such as the peeling of the bonding boundary face and deformation of the backing plate are becoming even more serious.

As an example, a target assembly was prepared by diffusion bonding an aluminum alloy (A5052) backing plate to a 350 mm cobalt target (purity of 5N) having a thickness of 3 mm in a vacuum, at 450° C. with a bearing of 15 kgf/mm$^2$, and retained for 5 hours. Water leaked when this was used for the sputtering at a sputtering power of 30 KW. The cause of this was due to the center portion deforming to a convex shape and the diffusion bonding portion partially peeling off, and the aluminum alloy of the backing plate becoming deformed thereby.

In light of the foregoing circumstances, conventional diffusion bonding and backing plates are not able to prevent the generation of warps and peeling upon diffusion bonding, and the discovery of a new material and diffusion method was in need.

SUMMARY OF THE INVENTION

In view of the above, provided is a diffusion bonding target assembly of a high-purity cobalt target and a copper alloy backing plate capable of effectively sputtering a high purity cobalt ferromagnetic target and which does not generate warping or peeling upon diffusion bonding even under severe conditions such as bonding with the backing plate and high power sputtering, and the manufacturing method thereof.

As a result of intense study, the present inventors have discovered that warping and peeling may be effectively prevented by suitably selecting a material to be intervened upon diffusion bonding with a strong backing plate.

Based on the foregoing discovery, the present invention provides: 1) a diffusion bonding target assembly of a high purity cobalt target and a copper chrome alloy or copper zinc backing plate, wherein aluminum or aluminum alloy having a thickness of 2 mm or more is used as the insert material upon diffusion bonding the target assembly, and the warp after bonding is 1.5 mm or less; and 2) a diffusion bonding target assembly of a high purity cobalt target and a copper chrome alloy or copper zinc backing plate, wherein aluminum or aluminum alloy having a thickness of 2 mm or more is used as the insert material upon diffusion bonding a high purity cobalt target and a copper chrome alloy or copper zinc alloy backing plate in a vacuum at a temperature of 200° C. to 450° C. under a pressure condition of 1 to 20 kg/mm$^2$, and the warp after bonding is 1.5 mm or less.

DESCRIPTION OF THE PREFERRED EMBODIMENTS

Upon examining a backing plate with minimal warping and which does not deform even with high power sputtering after diffusion bonding, it has been discovered that the use of copper chrome alloy or copper zinc alloy (hereinafter referred to as copper alloy) as the backing plate is effective.

Next, examined was the diffusion bonding of a cobalt target and a copper alloy backing plate. As described above, since it is necessary to maintain a low magnetic permeability with a cobalt target, the diffusion bonding temperature must be set to 450° C. or less.

As a result, it is found that using aluminum or aluminum alloy having a thickness of 2 mm or more as the insert material is extremely effective.

The reason it is necessary for the aluminum or aluminum alloy as the insert material to have a thickness of 2 mm or more is because this aluminum or aluminum alloy will become sufficiently soft at the temperature upon diffusion bonding, an active new surface will appear from the destruction of the surface oxide film from a microscopic perspective and atoms will therefore become diffused easier, and stress arising from the difference in thermal expansion between the target and backing plate upon cooling to room temperature after diffusion bonding may be alleviated with such aluminum or aluminum alloy.

Further, when the foregoing insert material is not inserted, it has become clear that bonding is practically difficult at a temperature of 450° C. or less.

Upon bonding, with the foregoing aluminum or aluminum alloy having a thickness of 2 mm or material, an assembly was obtained by diffusion bonding a high purity cobalt target and a copper alloy backing plate in a vacuum at a temperature of 200° C. to 450° C. under a pressure condition of 1 to 20 kg/mm$^2$ in order to bond a high purity cobalt target and copper alloy backing plate.

It is not preferable if the temperature is less than 200° C. since the overall diffusion bonding will become difficult, and not preferable when over 450° C. since the magnetic permeability of the cobalt target will increase. Diffusion bonding is therefore performed within the foregoing temperature range.

Figure 1:
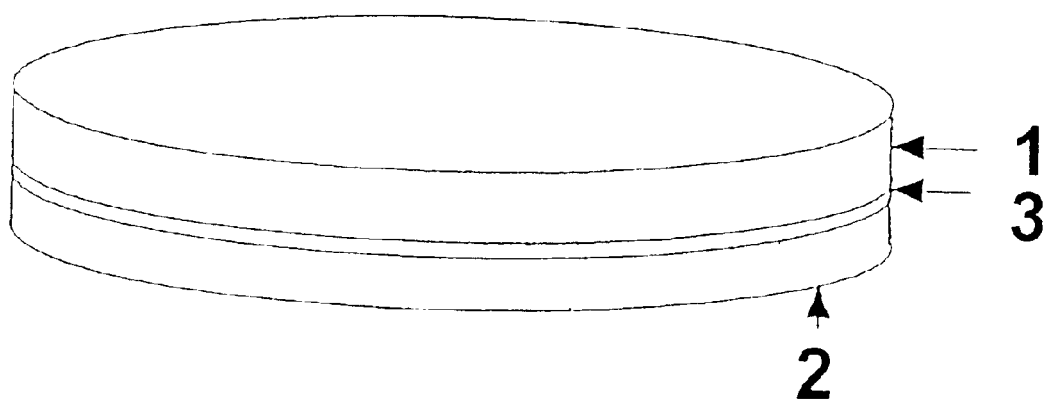
FIG. 1 is a schematic view of the high purity cobalt target, insert material and backing plate assembly.
Figure 2:
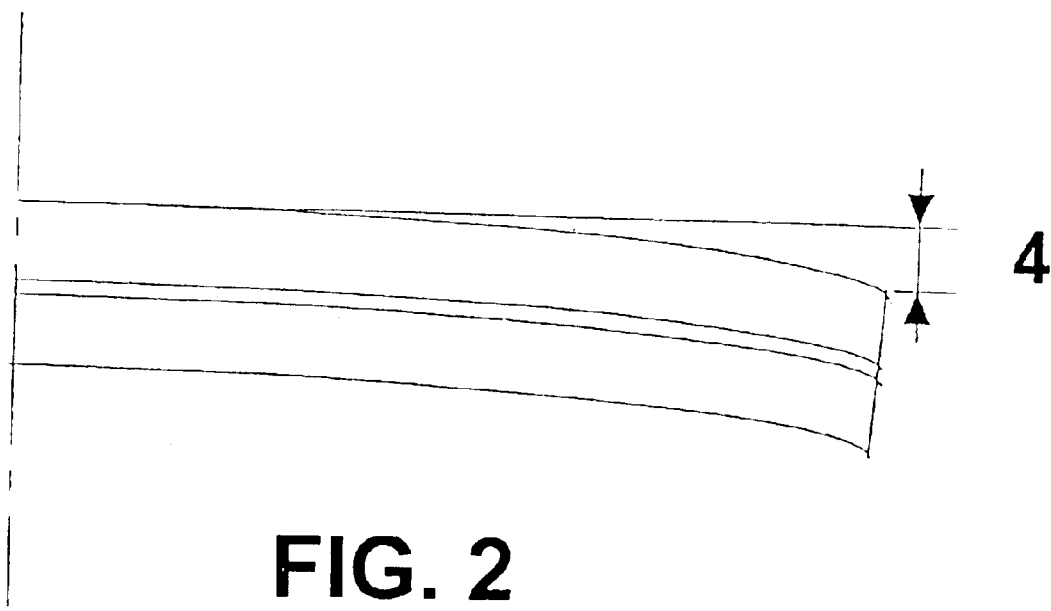
FIG. 2 is an explanatory diagram of the warp amount after diffusion bonding.

FIG. 1 is a schematic view of the high purity cobalt target, insert material and backing plate assembly; and FIG. 2 is an explanatory diagram of the warp amount after diffusion bonding. These diagrams illustrate a target material 1, a backing plate material 2. an insert material 3, and warp amount (mm) 4, respectively.

EXAMPLES AND COMPARATIVE EXAMPLES

Next, the present invention will be explained based on the Examples. These Examples are for facilitating the understanding of the invention, and the present invention shall not be limited thereby. In other words, the present invention covers other examples and modifications based on the technical spirit of this invention.

Example 1

A high purity cobalt plate having a thickness of 6 mm was prepared by extending the raw material of high purity cobalt of 99.999 wt % (5N) through warm pressure application at 450° C., and a target having a diameter of 350 mm and thickness of 3 mm was finished with mechanical processing.

Copper chrome alloy (chrome content of 1 wt %) was used as the backing plate. Two types of pure aluminum (A-1050) plates of 2 mm and 6 mm, respectively, were used as the insert materials.

Each of a diffusion bonding boundary face of the sputtering target, the Insert material and the backing plate was washed ultrasonically by using acetone as a solvent and was further washed enough In isopropyl alcohol.

These assemblies were enclosed In a vacuum (degree of vacuum is 0.1 torr or less) inside a steel container and diffused bonded with hot isostatic pressing (HIP) at 450° C.×4 h under a pressure of 15 kg m$^2$. The steel container was removed with mechanical processing after the bonding. A 2 mm pure aluminum (A-1050) plate was used as the insert material, and a target assembly was prepared with a similar method upon changing the HIP temperature to 300° C. and 200° C.

The warp amount was measured with a thickness gauge with the cobalt target up. Also, the bonding status was confirmed with ultrasonic flaw detection. The results are shown in Table 1. Further, 10 samples were prepared for each experiment, and the results are an average value of the measurement values of such samples.

Comparative Example 1

With the same method as Example 1, a high purity cobalt plate having a thickness of 6 mm was prepared by extending the raw material of high purity cobalt of 99.999 wt % (5N) through warm pressure application at 450° C., and a target having a diameter of 450 mm and thickness of 3 mm was finished with mechanical processing.

Copper chrome alloy (chrome content of 1 wt %) was similarly used as the backing plate. The aluminum insert material was set to 0.3 mm and 0.4 mm.

As other insert materials, a nickel plate and a silver plate having a thickness of 2 mm were also used. Further shown is an example where aluminum having a thickness of 2 mm was used as the insert material and diffusion bonding was performed at 175° C., which is a temperature lower than the temperature condition of the present invention.

Table 1 is shown the result of Example and Comparative Example.

TABLE 1

| | Type of Insert Material | Thickness (mm) of Insert Material | Bonding Temperature (° C.) | Wrap Amount (mm) |
| --- | --- | --- | --- | --- |
| Example 1 | Pure Aluminum | 2 | 450 | 1.5 |
| | Pure Aluminum | 6 | 450 | 0.8 |
| | Pure Aluminum | 2 | 300 | 1.2 |
| | Pure Aluminum | 2 | 200 | 0.6 |
| Comparative Example 1 | Pure Aluminum | 0.3 | 450 | Peeling of Boundary Surface Periphery |
| | Pure Aluminum | 0.4 | 450 | Peeling of Boundary Surface Periphery |
| | Nickel | 2 | 450 | No Bonding |
| | Silver | 2 | 450 | No Bonding |
| | Pure Aluminum | 2 | 175 | Partial No Bonding |

Pure Aluminum: (A-1050)

As evident from Table 1, with the same diffusion bonding temperature, the warp amount decreased in accordance with the increase in the thickness of pure aluminum as the insert material. Further, the resulting warp amount was minimal in a range of 1.5 to 0.6 mm.

Moreover, when the thickness of the insert material is 2 mm and the bonding temperature is reduced to 300° C. or 200° C., the warp amount was 1.2 mm and 0.6 mm. and no problems could be recognized in terms of the value of the warp amount. Nevertheless, portions that were not bonded could be found when the bonding temperature is less than 200° C.

Contrarily, in Comparative Example 1 where the thickness of the aluminum insert materials is 0.3 mm and 0.4 mm, warping is severe and the boundary face periphery began to peel.

In addition, in the case of employing a nickel plate or silver plate having a thickness of 2 mm as the insert material, the result was that the high purity cobalt target and copper chrome alloy backing plate did not bond even though the insert material had sufficient thickness.

Accordingly, it is clear that an aluminum insert material having a thickness of 2 mm or more is optimum when bonding a high purity cobalt target and a copper chrome alloy backing plate. Further, although not shown in the Examples, similar results were obtained upon using an aluminum alloy insert material such as A5052.

A sputtering test was performed at 30 KW to the targets used in the Examples, but vacuum deterioration caused by water leakage or the like could not be acknowledged. Moreover, the reduction in sputtering efficiency of the cobalt target did not change. Further, upon examining the high purity cobalt target-backing plate assembly of the Examples with ultrasonic flaw detection, it has been confirmed that there were no portions which were not bonded.

A superior effect is yielded in that a highly reliable high purity cobalt target-backing plate assembly capable of withstanding high power sputtering could be obtained without lowering the sputtering efficiency of the high purity cobalt target, while assuring the target thickness by reducing the warp amount after diffusion bonding, and eliminating or at least alleviating corrective procedures.

What is claimed is:

1. A diffusion bonding target assembly comprising a high purity cobalt target and a copper alloy backing plate made of a copper chrome alloy or a copper zinc alloy, wherein aluminum or aluminum alloy having a thickness of 2 mm or more is used as an insert material therebetween upon diffusion bonding said target assembly, and wherein said target assembly has a warp after bonding of 1.5 mm or less.

2. A method of manufacturing a diffusion bonding target assembly comprising the step of diffusing bonding a high purity cobalt target and a copper alloy backing plate made of a copper chrome alloy or a copper zinc alloy, wherein aluminum or aluminum alloy having a thickness of 2 mm or more is used as an insert material therebetween during said diffusion bonding step, wherein said diffusion bonding step is accomplished in a vacuum at a temperature of 200° C. to 450° C. under a pressure condition of 1 to 20 kg/mm$^2$, and wherein said target assembly has a warp after said diffusion bonding step of 1.5 mm or less.

* * * * *

UNITED STATES PATENT AND TRADEMARK OFFICE
CERTIFICATE OF CORRECTION

PATENT NO. : 6,793,124 B1
DATED : September 21, 2004
INVENTOR(S) : Takahashi et al.

It is certified that error appears in the above-identified patent and that said Letters Patent is hereby corrected as shown below:

Title page, Item [54] and Column 1, line 1,
Title, "TARGET ASSEMLY OF" should read -- TARGET ASSEMBLY OF --

Column 3,
Line 14, "2 mm or material," should read -- 2 mm or more as the insert material, --
Line 53, "the Insert material" should read -- the insert material --
Line 57, "enclosed In a vacuum" should read -- enclosed in a vacuum --
Line 60, "of 15 kg m$^2$" should read -- of 15 kg mm$^2$ --

Column 4,
Line 28, (Title of Last Column of Chart) "Wrap Amount" should read
-- Warp Amount --
Line 51, "1.5 to 0.6 mm." should read -- 2 to 0.8 mm. --

Signed and Sealed this

Eleventh Day of January, 2005

JON W. DUDAS
*Director of the United States Patent and Trademark Office*